United States Patent [19]
Wu

[11] Patent Number: 6,151,794
[45] Date of Patent: Nov. 28, 2000

[54] APPARATUS FOR HEAT TREATING AN OBJECT

[75] Inventor: Chia-Fang Wu, Tainan, Taiwan

[73] Assignee: Taiwan Semiconductor Manufacturing Co., Ltd., Hsin Chu, Taiwan

[21] Appl. No.: 09/324,256

[22] Filed: Jun. 2, 1999

[51] Int. Cl.[7] .................................................. F26B 19/00
[52] U.S. Cl. ................... 34/68; 34/72; 34/76; 34/202; 34/218; 34/231
[58] Field of Search .............................. 34/73, 74, 77, 34/78, 79, 75, 76, 92, 60, 68, 418, 218

[56] References Cited

U.S. PATENT DOCUMENTS

| | | | |
|---|---|---|---|
| 5,226,242 | 7/1993 | Schwenkler | 34/78 |
| 5,462,603 | 10/1995 | Murakami | 118/719 |
| 5,504,831 | 4/1996 | Sandhu et al. | 392/418 |
| 5,588,827 | 12/1996 | Muka | 432/5 |
| 5,855,077 | 1/1999 | Nam et al. | 34/409 |

*Primary Examiner*—Pamela Wilson
*Assistant Examiner*—Michelle A. Mattera
*Attorney, Agent, or Firm*—Tung & Associates

[57] ABSTRACT

An apparatus for heat treating an object and specifically a substantially flat object described. The apparatus may be a hot plate post-baking apparatus for heat treating a substantially flat object such as a photomask used in a semiconductor photolithographic process. The apparatus is provided with an upper heat reflector plate that is equipped with upwardly curved edge portions such that the amount of heat reflected by the reflector can be controlled and the center region on the substantially flat object can be temperature compensated for achieving more uniform temperature profile across the entire surface of the mask. By utilizing the heat reflector plate in a post-baking apparatus, the normally observed 5° C. temperature difference across a mask surface is substantially eliminated.

20 Claims, 3 Drawing Sheets

APPARATUS FOR HEAT TREATING AN OBJECT

FIELD OF THE INVENTION

The present invention generally relates to an apparatus for heat treating an object and more particularly, relates to an apparatus for heat treating a substantially flat object by utilizing an upper reflector plate that has upwardly curved edge portions in a heating chamber facing the substantially flat object such that heat may be more uniformly reflected onto the surface of the object treated.

BACKGROUND OF THE INVENTION

In the semiconductor device manufacturing, a photolithography process is frequently used in reproducing a circuit onto a wafer. In order to transfer an image onto the wafer surface, i.e., an image of an IC circuit, a photomask must be used.

A mask for photolithography is usually constructed on a transparent plate, called a blank, covered with a patterned film of opaque material. The blank may be made of soda lime glass, borosilicate glass or fused quartz. In advanced photolithographic technology, fused quartz is more frequently used for its advantages of being transparent to deep UV, and for its low thermal expansion coefficient. The low expansion coefficient is important when the minimum feature size is less than 1.5 $\mu$m. Furthermore, distortions related to thermal expansion become more pronounced as the mask size is increased. As a result, quartz masks are recommended for exposures onto 150 mm and larger wafer sizes and for minimum feature sizes of smaller than 1.5 $\mu$m.

The quartz material is selected also for its low sodium content, its high chemical stability and its high light transmission character. On top of the quartz plate, an opaque material having typically a thickness smaller than 100 nm is formed of chrome, and covered with an anti-reflective coating film such as chrome oxide to suppress interferences at the wafer surface. A suitable thickness for the chrome layer is normally 1,000 Å, while a suitable thickness for the chrome oxide layer is normally 200 Å.

High quality photomasks must meet stringent property requirements such as flatness, accuracy of pattern placement, minimum feature size, linewidth control over the entire area of the mask, and defect density. A small variation in the flatness can alter the optical path length and thus cause large distortions on the resist due to defocusing. Temperature variations occurred during mask fabrication and during the mask use account for most of the misplacement of the pattern and misregistration between masking levels. It has been found that, for example, a 1° change in temperature in the mask-making process can cause a misplacement of approximately 0.1 $\mu$m over a 100 mm diameter area on a quartz mask.

The thermal stability of the quartz mask, including that of the chrome film coated on the mask, is therefore an important factor in achieving a successful photomasking process. To ensure the maximum thermal stability of a quartz mask is achieved, a post-baking process is normally carried out after the mask making process. A typical post-baking apparatus 10 that is commercially available is shown in FIG. 1. In the post-baking apparatus 10, a chamber 12 is provided which consists of an upper plate 14 mounted in an upper plate mounting frame 16 and surrounded by sidewalls 18, enclosing a bottom plate 20. The bottom plate 20 is provided with a plurality of apertures 24 along a peripheral edge of the plate for flowing an inert gas therethrough. A suitable inert gas used is nitrogen. The bottom plate 20 is heated by electrical heating means (not shown) that is embedded in the plate body. A nitrogen inlet 28 is further provided for flowing a nitrogen into the plurality of apertures 24 in the bottom plate 20. The upper plate 14 is used as a heat reflector and has an exhaust port 32 formed at a center of the plate for exhausting the heated inert gas such that it may be recirculated.

A detailed, exploded view of the heating chamber 12 of the post-baking apparatus 10 is shown in FIG. 2. The upper plate, or the heat reflector plate 14 is supported at four corners by insulating support posts 34 which may be suitably made of a ceramic material. On top of the bottom plate 20, a substantially flat object 30 such as a photomask is supported by support pins 36. A robot blade (not shown) is used for loading and unloading the photomask 30 into and out of the heating chamber 12. A plurality of photosensors 38 are further provided for determining the post-baking temperature, which is normally higher than 100° C.

A more detailed view of the interior components of the heating chamber 12 is shown in FIGS. 3, 4 and 5. FIG. 3 illustrates an enlarged, cross-sectional view of the upper reflector plate 14, the bottom plate 20, the retractable support pins 36 and the photosensors 38. It is seen that a substantially flat object 30, such as a photomask is positioned on top of the bottom plate 20. An enlarged, partial view of the same components is shown in FIG. 4 indicating a minimum distance maintained between the heat reflector plate 14 and the photomask 30 is X which may be suitably determined depending on the characteristics of the photomask.

In the configuration of the heat reflector plate 14 shown in FIGS. 3, 4 and 5, the post-baking apparatus used for mask making cannot achieve thermal uniformity during the post-baking process. The temperature non-uniformity comes from the low thermal conductivity of quartz and its relatively large thickness of approximately 0.25 in. It has been found that, in a conventional post-baking apparatus, the temperatures achieved at the center of the photomask and at the corners of the photomask deviate by approximately 5° C. Such temperature gradient is sufficient to cause a large difference in the material properties in subsequent processes of the photomask. The large temperature differential is caused by the fact that before a photomask reaches a steady state temperature condition, heat transfer at the corners is significantly more than at the center due to larger heat transfer area available at the corners.

It is therefore an object of the present invention to provide an apparatus for heat treating a substantially flat object that does not have the drawbacks or shortcomings of the conventional apparatus.

It is another object of the present invention to provide an apparatus for heat treating a substantially flat object that does not have the drawback of forming a temperature differential on the surface of the flat object during heat treating.

It is a further object of the present invention to provide a post-baking apparatus for heat treating a substantially flat object by utilizing a specially designed heat reflector that is positioned juxtaposed to a top surface of the flat object.

It is another further object of the present invention to provide a post-baking apparatus for a substantially flat object that is equipped with an upper heat reflector that has edge portions curved upwardly away from the object to be heat treated.

It is still another object of the present invention to provide a post-baking apparatus for heat treating a substantially flat object which is equipped with an upper heat reflector plate that has edge portions curved upwardly forming an angle between about 15° and about 45° from a horizontal plane.

It is yet another object of the present invention to provide a post-baking apparatus for heat treating a quartz photomask by positioning the photomask in a heating chamber adjacent and opposite to a heat reflector plate that has edge portions curved upwardly.

It is still another further object of the present invention to provide a hot plate heating apparatus for post-backing a quartz photomask that is capable of heating the photomask and achieving an uniform temperature across the mask surface.

It is yet another further object of the present invention to provide a hot plate heating apparatus for post-baking a quartz photomask by utilizing an upper heat reflector plate that has edge portions curved upwardly such that more uniform reflected heat is available for heating the photomask positioned therebelow.

SUMMARY OF THE INVENTION

In accordance with the present invention, an apparatus for heat treating a substantially flat object is provided.

In a preferred embodiment, an apparatus for heat treating an object can be provided which includes a chamber adapted for holding an upper plate, a lower plate and an object thereinbetween; an upper plate that has upwardly curved edge portions spaced-apart from and which reflect heat onto a top surface of the object, and a lower plate that has a multiplicity of apertures in a top surface through which flows a heated gas onto the object.

In the apparatus for heat treating an object, the chamber may further include an exhaust port for exhausting the heated gas. The heated gas used may be an inert gas, such as $N_2$. The apparatus may further include support pins retractably mounted in the lower plate for supporting the object during a heat treating process. The upwardly curved edge portions of the upper plate provide uniform heating on the object. The object being heat treated may be a photomask, or a photomask fabricated of a quartz plate. The lower plate may be heated by electrical heating elements. The upwardly curved edge portions of the upper plate may have a curvature of between about 15° and about 45° when measured from a horizontal plane.

In another preferred embodiment, a hot plate heat treating apparatus can be provided which consists of an enclosed chamber that has a heated bottom plate; sidewalls and a top plate; the heated bottom plate is adapted for supporting a substantially flat object thereon and the top plate has upwardly curved edge portions such that heat is uniformly reflected onto a top surface of the substantially flat object.

In the hot plate heat treating apparatus, the upwardly curved edge portions of the top plate may have a curvature of between about 15° and about 45° measured from a horizontal plane. The top plate may be a heat reflector, while the substantially flat object may be a mask for photolithography, or a mask made of quartz plate. The hot plate heat treating apparatus may further include an exhaust port for exhausting a heated gas or may further include a heated bottom plate equipped with a plurality of apertures for flowing a heated gas toward the substantially flat object. The hot plate heat treating apparatus may further include a plurality of support pins retractably mounted in the heated bottom plate for supporting the substantially flat object during a heat treating process. The heated gas utilized may be a heated $N_2$. The apparatus may further include electrical heating elements embedded in the bottom plate.

BRIEF DESCRIPTION OF THE DRAWINGS

These and other objects, features and advantages of the present invention will become apparent from the following detailed descriptions and the appended drawings in which.

DETAILED DESCRIPTION OF PREFERRED EMBODIMENT

The present invention discloses an apparatus for heat treating an object, or a substantially flat object. The present invention heat treating apparatus may be a hot plate apparatus used for post-baking a substantially flat object such as a photomask used in semiconductor photolithography process. The apparatus can be provided with a chamber that is adapted for holding an upper plate, a lower plate and an object to be heat treated thereinbetween. The upper plate is also a heat reflector plate which has upwardly curved edge portions such that heat may be more uniformly reflected from the heat reflector plate onto a top surface of the substantially flat object during the heat treating process. The apparatus is further equipped with a lower plate that is heated by heating elements embedded therein and equipped with a multiplicity of apertures in a top surface for flowing a heated gas therethrough for providing uniform heating on the substantially flat object supported on top of the bottom plate. The heated gas may be suitably an inert gas, such as $N_2$. The upwardly curved edge portions of the heat reflector plate may have a curvature of between about 15° and about 45° as measured from a horizontal plate. The substantially flat object may be supported on the bottom plate by a plurality of support pins that are retractably mounted in the bottom plate such that heated gas may flow under the flat object to promote a more uniform heating or heat treating process.

The present invention novel design of an upwardly curved reflector plate reduces the temperature differential formed between a center region and corner regions such that more uniform temperature distribution can be achieved across the entire mask surface. The novel heat reflector therefore provides a more uniform temperature distribution during the post-baking process, or the heat treating process. The uniform post-baking process further reduces variations in material properties, and process errors in descum and wet etching.

Figure 1:
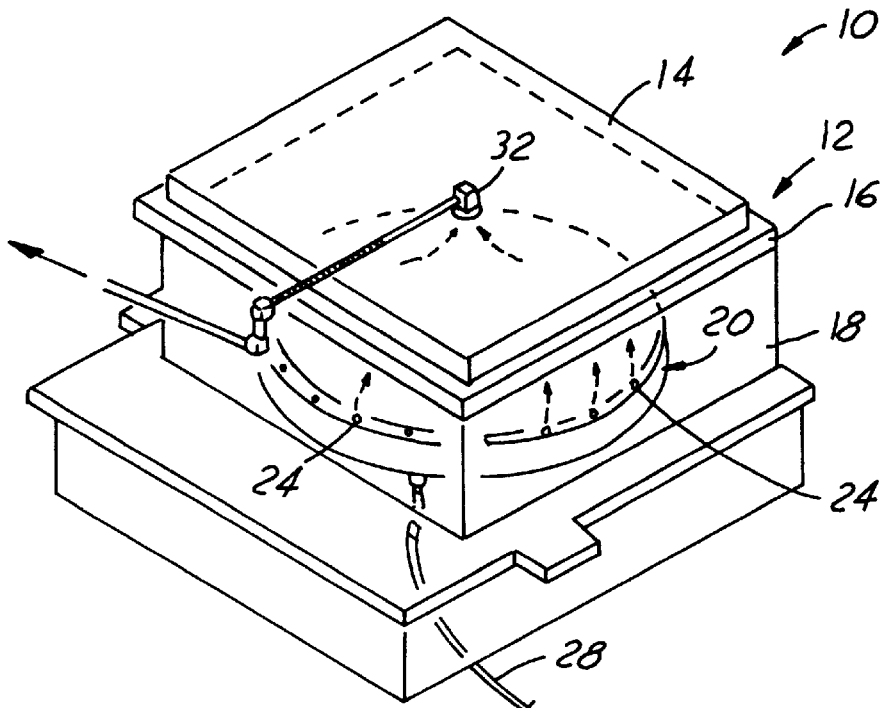
FIG. 1 is a perspective view of a conventional post-baking apparatus.
Figure 2:
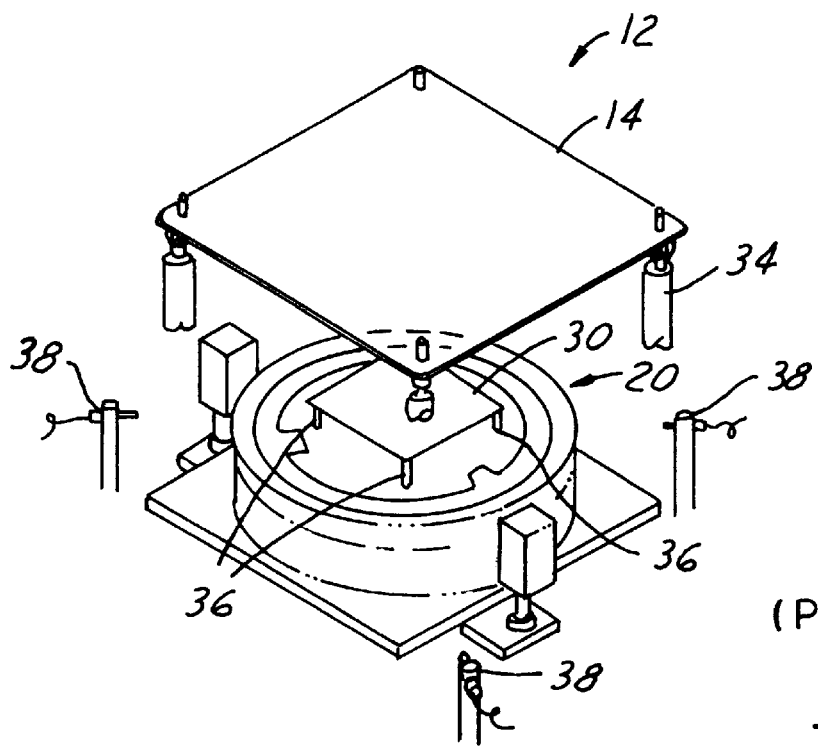
FIG. 2 is a perspective view of on upper reflector plate and a bottom plate of the conventional post-baking apparatus of FIG. 1.
Figure 3:
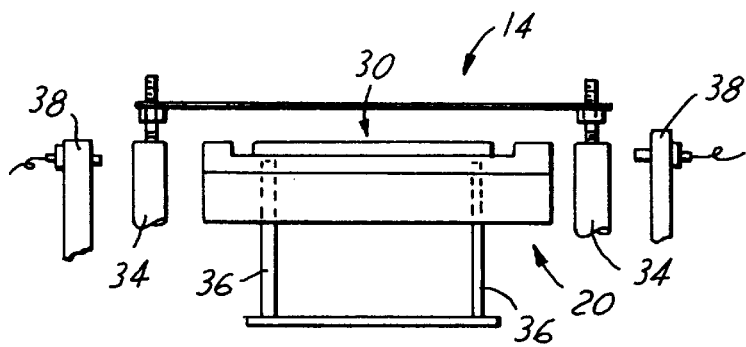
FIG. 3 is a cross-sectional view of the conventional post-baking apparatus of FIG. 2.
Figure 4:
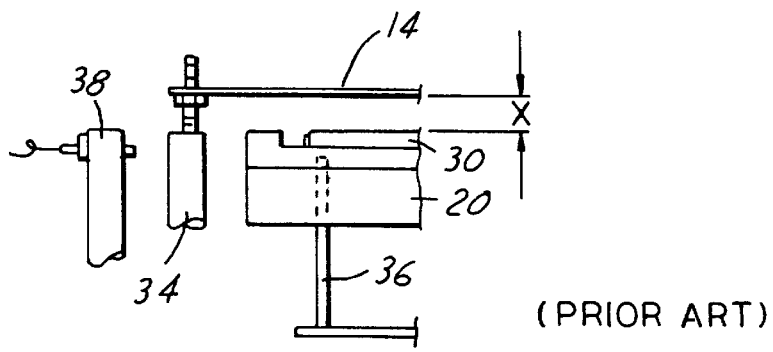
FIG. 4 is a partial, cross-sectional view of the conventional post-baking apparatus of FIG. 2.
Figure 5:
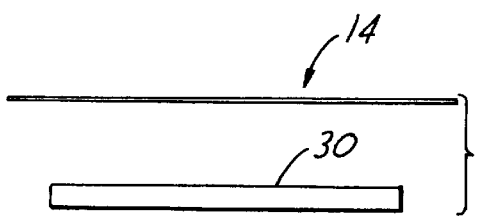
FIG. 5 is a cross-sectional view of the flat heat reflector used in the conventional post-baking apparatus.

It has been found that a major element in achieving good post-baking temperature uniformity is to achieve more uniform heat transfer. Heat transfer is normally achieved through conduction, convection and radiation. In the conventional apparatus, shown in FIG. 5, the temperatures at the corners of the photomask are always higher than the temperature at the center before the post-baking process reaches its steady state. Even in a well insulated isothermal heating chamber, there is still a 5° C. temperature difference across the surface of the mask. The present invention novel new design of an upwardly curved reflector is based on the different distances between the mask surface and the reflector which cause different convection phenomena as shown by the equation:

$$Q=C \text{ (temperature differential between two surfaces/distance between two surfaces)}^{0.25} \times \text{ temperature difference between two surfaces}$$

Wherein C is a constant that is related to the type of heat flow.

Figure 6:
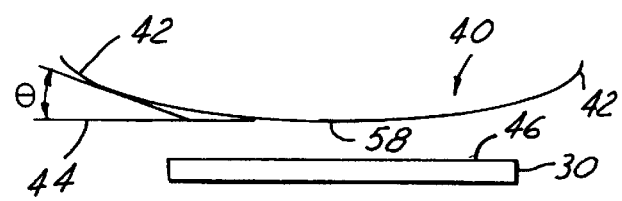
FIG. 6 is a cross-sectional view of a present invention heat reflector plate positioned over a photomask.
Figure 7:
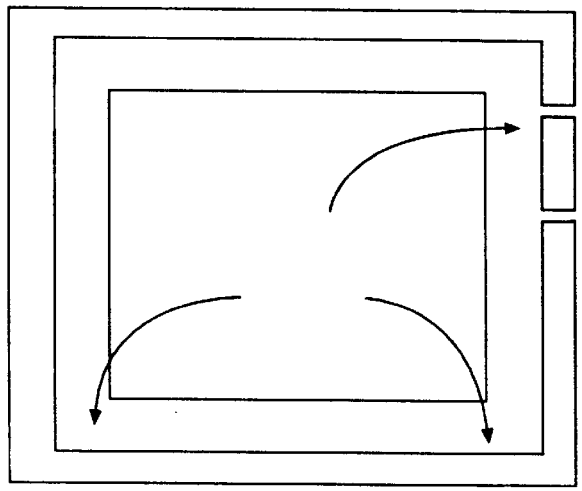
FIG. 7 is a plane view of the present invention heat reflector plate in relation to a photomask positioned thereunder.

It has been found that before the substantially flat object reaches steady state in temperature, the heat transfer in the corner regions is much better than the center region because of the larger heat transfer areas available at the corner regions. The present invention novel new design of a heat reflector plate utilizes upwardly curved edge portions of the reflector plate to compensate for such difference in heat transfer by inducing a higher air flow through the center region. This is shown in FIGS. 6 and 7. Based on the above equation, it is evident that the convection heat transfer term increases by approximately 20% when the distance between two opposingly-situated plates is reduced to one half. For different post-baking systems, the distance between the mask surface and the heat reflector should be optimized.

Referring now to FIG. 6, wherein a cross-sectional view of the present invention heat reflector (or the upper plate) 40 is shown. The upwardly curved edge portions 42 have a curvature of θ between about 15° and about 45° when measured from a horizontal plane 44. This is shown in FIG. 6. A more preferred curvature as indicative by θ is between about 20° and about 30°.

As shown in FIG. 7, the present invention novel reflector plate 40 enables increased flow of heated gas at the center region 48 with respect to the corner regions 52. It should be noted that, since FIG. 7 is a plane view, the upwardly curved edge portions 42 are not shown. The different distance existing between the mask surface 46 and the reflector surface 58 therefore causes different convection phenomena occurring between the heat reflector 40 and the mask 30. By utilizing the present inventions novel upwardly curved edge portions on the reflector plate, the heat transfer at the center region of the mask is greatly improved and becomes similar to the heat transfer occurring at the corner regions. As a result, a significantly improved temperature uniformity across the entire surface of the mask 30 is achieved.

Figure 8:
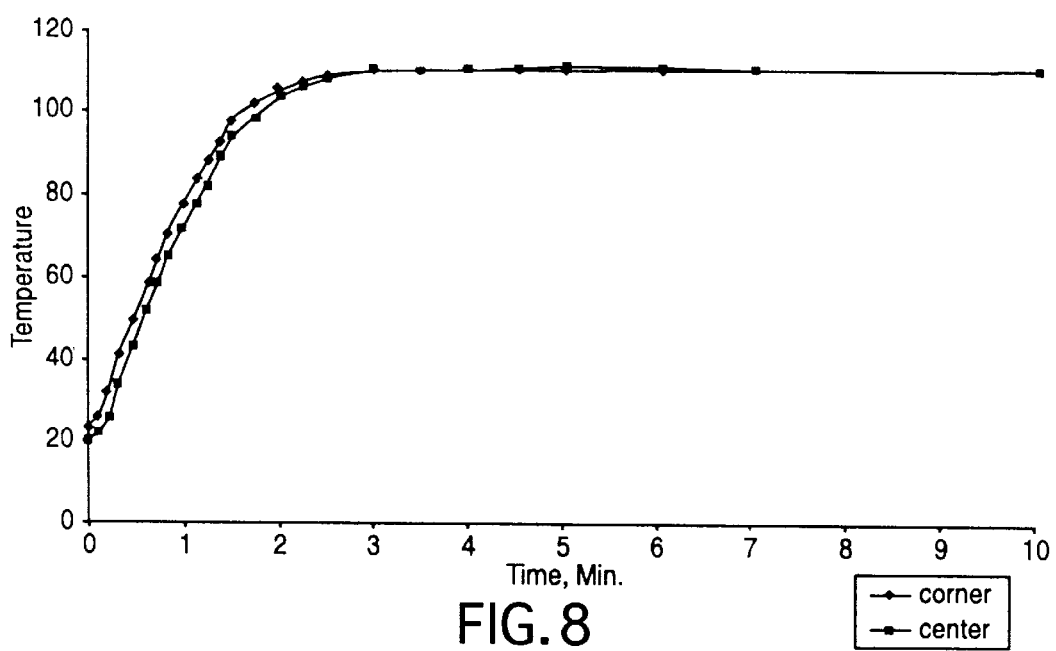
FIG. 8 is a graph illustrating the effectiveness of the present invention curved heat reflector plate.

The effectiveness of the present inventions novel reflector plate equipped with upwardly curved edge portions is shown in FIG. 8. Temperatures at various points were measured across the surface area of the mask while temperatures at the corner regions are plotted to compare with temperatures at the center region against heating time. It is seen even at the beginning of the heating cycle, i.e., prior to 3 minutes, the temperature differences at the corner regions and at the center are very minimal, i.e., significantly less than that obtained in a conventional post-baking apparatus equipped with a flat heat reflector.

The present invention novel apparatus has therefore been amply described in the above descriptions and in the appended drawings of FIGS. 6–8.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. An apparatus for heat treating an object comprising:
   a chamber adapted for holding an upper plate, a lower plate and an object thereinbetween,
   an upper plate having upwardly curved edge portions spaced-apart from and reflecting heat onto a top surface of said horizontally positioned object, and
   a lower plate having a multiplicity of apertures in a top surface spaced-apart from and flowing heated gas onto said object.

2. An apparatus for heat treating an object according to claim 1, wherein said chamber further comprises an exhaust port for exhausting said heated gas.

3. An apparatus for heat treating an object according to claim 1, wherein said heated gas is an inert gas.

4. An apparatus for heat treating an object according to claim 1, wherein said heated gas is $N_2$.

5. An apparatus for heat treating an object according to claim 1 further comprising support pins retractably mounted in said lower plate for supporting said object during a heat treating process.

6. An apparatus for heat treating an object according to claim 1, wherein said upwardly curved edge portions of said upper plate provide uniform heating on said object.

7. An apparatus for heat treating an object according to claim 1, wherein said object being heat treated is a photomask.

8. An apparatus for heat treating an object according to claim 1, wherein said object being heat treated is a quartz plate.

9. An apparatus for heat treating an object according to claim 1, wherein said lower plate is heated.

10. An apparatus for heat treating an object according to claim 1, wherein said upwardly curved edge portions of said upper plate have a curvature of between about 15° and about 45° when measured from a horizontal plane.

11. A hot plate heat treating apparatus comprising an enclosed chamber having a heated bottom plate, surrounding sidewalls and a top plate, said heated bottom plate supporting horizontally a substantially flat object thereon, said top plate having upwardly curved edge portions such that heat is uniformly reflected onto a top surface of said substantially flat object.

12. A hot plate heat treating apparatus according to claim 11, wherein said upwardly curved edge portions of said top plate have a curvature of between about 15° and about 45° when measured from a horizontal plane.

13. A hot plate heat treating apparatus according to claim 11, wherein said top plate is a heat reflector.

14. A hot plate heat treating apparatus according to claim 11, wherein said substantially flat object is a mask for photolithography.

15. A hot plate heat treating apparatus according to claim 11, wherein said substantially flat object is a quartz plate.

16. A hot plate heat treating apparatus according to claim 11 further comprising an exhaust port for exhausting a heated gas.

17. A hot plate heat treating apparatus according to claim 11 further comprising a heated bottom plate equipped with a plurality of apertures for flowing a heated gas toward said substantially flat object.

18. A hot plate heat treating apparatus according to claim 11 further comprising a plurality of support pins retractably mounted in said heated bottom plate for supporting said substantially flat object during a heat treating process.

19. A hot plate heat treating apparatus according to claim 17, wherein said heated gas is heated $N_2$.

20. A hot plate heat treating apparatus according to claim 11 further comprising electrical heating elements embedded in said bottom plate.

* * * * *